United States Patent [19]
Rabovsky et al.

[11] Patent Number: 5,798,562
[45] Date of Patent: Aug. 25, 1998

[54] SEMICONDUCTOR DEVICE HAVING AN ISOLATION LAYER AND TWO PASSIVATION LAYERS WITH EDGES THAT ARE NOT ALIGNED WITH EACH OTHER

[75] Inventors: Johannes Rabovsky; Bernd Sievers, both of Hamburg, Germany

[73] Assignee: U.S. Philips Corporation, New York, N.Y.

[21] Appl. No.: 738,513

[22] Filed: Oct. 28, 1996

[30] Foreign Application Priority Data

Oct. 28, 1995 [DE] Germany ............... 195 40 309.6

[51] Int. Cl.⁶ ............... H01L 23/58; H01L 29/00
[52] U.S. Cl. ............... 257/632; 257/496; 257/510; 257/526; 257/638; 257/640; 257/642; 257/643; 257/649
[58] Field of Search ............... 257/496, 510, 257/526, 632, 640, 642–643, 649

[56] References Cited

U.S. PATENT DOCUMENTS

| | | | |
|---|---|---|---|
| 3,985,597 | 10/1976 | Zielinski | 257/643 |
| 4,001,870 | 1/1977 | Saiki et al. | 257/643 |
| 4,091,406 | 5/1978 | Lewis | 257/641 |
| 4,328,262 | 5/1982 | Kurahashi et al. | 257/643 |
| 4,440,580 | 4/1984 | Gahle | 438/370 |
| 4,477,965 | 10/1984 | Blossfeld | 438/234 |
| 4,600,624 | 7/1986 | Joseph et al. | 257/640 |
| 4,601,939 | 7/1986 | Gati et al. | 257/640 |
| 4,618,878 | 10/1986 | Aoyama et al. | 257/640 |
| 4,733,289 | 3/1988 | Tsurumaru | 257/640 |
| 4,778,774 | 10/1988 | Blossfeld | 438/234 |
| 4,786,610 | 11/1988 | Blossfeld | 438/362 |
| 5,013,674 | 5/1991 | Bergemont | 437/43 |
| 5,016,069 | 5/1991 | Bergemont | 257/316 |
| 5,055,906 | 10/1991 | Mase et al. | 257/640 |
| 5,366,911 | 11/1994 | Lur et al. | 437/40 |
| 5,384,271 | 1/1995 | Kwasnick et al. | 437/40 |
| 5,523,616 | 6/1996 | Den | 257/640 |
| 5,616,960 | 4/1997 | Noda et al. | 257/643 |
| 5,619,064 | 4/1997 | Cho | 257/649 |

FOREIGN PATENT DOCUMENTS 2-37747A  2/1990  Japan ............... H01L 21/78

Primary Examiner—Mahshid D. Saadat
Assistant Examiner—Ida Marie Soward

[57] ABSTRACT

The invention relates to a semiconductor device with a substrate, with at least one isolation layer with at least one window, with a passivation layer scheme lying on the isolation layer and a metallization lying on the passivation layer scheme, the latter comprising at least two dielectric layers of which the first dielectric layer covers the isolation layer with its edges as well as the substrate in an outer edge zone of the window, and of which the second dielectric layer covers the first dielectric layer also over the edge of the isolation layer and in a portion of the outer region of the window.

6 Claims, 1 Drawing Sheet

SEMICONDUCTOR DEVICE HAVING AN ISOLATION LAYER AND TWO PASSIVATION LAYERS WITH EDGES THAT ARE NOT ALIGNED WITH EACH OTHER

BACKGROUND OF THE INVENTION

The invention relates to a semiconductor device, particular a high voltage bipolar planar transistor with a substrate, at least one isolation layer with at least one window, a passivation layer scheme lying on the isolation layer and having a structured edge region, and a metallization deposited on the passivation layer scheme.

High voltage bipolar planar transistors are required for switch mode power supplies, motor controls, DC converters, AC converters, proximity switches, wide-band band amplifiers, NF amplifiers, ultrasound generators, interruption-free power supplies, high-voltage cut-outs, flicker-free controls for picture tubes, fluorescent lamp circuits, and automotive electronics. A further major application is the field of low-noise controlled three-phase current drives because the switching-off and higher operating frequency requirements cannot be fulfilled by thyristors. The bipolar transistor principle is superior to the unipolar MOS principle regarding current density, and thus costs, in the relevant voltage range from 500 to 1,200 V.

Phototransistors also belong to the high voltage bipolar planar transistors. Voltage resistance values up to a few kV are usual here.

To increase the breakdown voltage such bipolar planar transistors require a reduction of the electrical edge field strength achieved by a suitable shaping of the edge contours of the transistor. In particular, a passivation layer scheme between the substrate and the metallization must be provided in order to increase the breakdown voltage of the transistor substantially and to avoid a premature breakdown of the transistor, e.g. at voltage or current peaks for this purpose. The isolation layer of thermal oxidized $SiO_2$, and any further isolation layers, are reinforced with dielectric layers to form a surface passivation scheme, and the edge region of this passivation scheme at the contact windows and at the transistor edges are beveled off suitable structuring.

During structuring of the edge region by photolithography and etching of layers according to the prior art, however, concave overhangs grooves may arise at the edges of the surface passivation scheme resulting from an underetching of individual layers.

Impurities, in particular moisture and etchant remainders, may be collected in these grooves, increasing the reverse currents of the semiconductor device and reducing its life test stability. Metal will also enter the concave overhangs when subsequently the metallizations are deposited in the contact windows. This reduces the current and voltage resistance. The underetched edges may also break off in the case of stronger underetching.

To remedy this, JP 2-37747 makes the suggestion to cover a first isolation layer on a silicon substrate with an intermediate layer having flush edges, and to cover these two layers with a further intermediate layer, which further intermediate layer is fully covered by a passivation layer.

This method requires two photolithographic process steps with an ensuing layer etching for forming the passivation layer scheme, and is thus labor-intensive and expensive. Moreover, the planar transistor thus formed has a small active area owing to the space required for the coverings.

SUMMARY OF THE INVENTION

The objective of the present invention is to provide a semiconductor device, in particular a high voltage bipolar planar transistor, having an improved passivation layer scheme with structured edge regions without groove information.

According to the invention, this object is achieved by means of a semiconductor device with a substrate, at least one isolation layer with at least one window, a passivation layer scheme lying on the isolation layer and a metallization lying on the passivation layer scheme, wherein the passivation layer scheme comprises at least two dielectric layers, the first dielectric layer covering the isolation layer with its edges as well as the substrate in an outer edge zone of the window, and the second dielectric layer covering the first dielectric layer also over the edge of the isolation layer and in a portion of the outer region of the window.

Such a semiconductor device distinguishes itself by an improved voltage resistance, low leak on currents, and an increased stability during life test. It is an advantage of the planar transistor according to the invention that the electrical parameters are very stable due to the protection of the transitions to the contact window and to the device edge by the passivation layer scheme according to the invention. Transient frequency values $f_T$ up to 300 MHz are achieved, total power dissipation up to 1 W, and breakdown voltage values up to 1 kV. In spite of the structured passivation layer scheme as compared to the prior art, the active surface area of the transistor is comparatively large thanks to the space-saving arrangement of the passivation according to the invention with its structured edge region. A further advantage is that rejects in on wafer fabrication caused by the formation of concave overhangs grooves both at the flanks of the dielectric layers and at the flanks of the isolation layers are absolutely avoided.

Preferably, within the framework of the invention, each of the dielectric layers has an even layer thickness. In conjunction with the overlaps of the layers of the passivation scheme this results in a beveled edge with a plane profile which reduces the electrical edge field strength and improves the voltage resistance. The beveled edge with flat profile also improves the adhesion of the metallization to the passivation layer scheme in the area of the contact window and the cohesion of said scheme where it crosses over the edge of the window.

Preferably, within the framework of the invention, the semiconductor device has two isolation layers, the first isolation layer consisting of a thermally generated silicon oxide and the second isolation layer consisting of a thermally generated silicon oxide comprising phosphorus. The thermally generated silicon oxide comprising phosphorus (phosporus-rich thermal oxide) adheres particularly well to the substrate and to the isolation layer made of thermally generated silicon oxide. It acts as an ion getter and thus protects the subjacent device against any contamination which would pose a major threat to the reliability of the semiconductor device.

Preferably, furthermore, the first dielectric layer is made of silicon nitride and the second dielectric layer is made of silicon dioxide.

It may be preferred within the framework of the present invention that the first dielectric layer is made of silicon oxide or silicon nitride and the second dielectric layer of polyimide.

It may be preferred, furthermore, that the first dielectric layer is made of polyimide and the second dielectric layer of silicon nitride.

These dielectric layers each have a high selectivity to the etchant necessary for structuring the respective other layer, so that the two layers can be structured in a single photolithographic step.

The invention also relates to a method of manufacturing a semiconductor device with a substrate, with at least one isolation layer having at least one window, with a passivation layer scheme lying on the isolation layer and a metallization lying on the passivation layer scheme, the passivation layer scheme comprising at least two dielectric layers, wherein a first and a second dielectric layer are deposited over the entire surface of the substrate which has at least one isolating layer with at least one window, into which dielectric layers one or several smaller windows are etched such that an outer edge zone of the original window remains covered by the first and the second dielectric layer, and subsequently the second dielectric layer is etched once more so that the second dielectric layer partly covers the first dielectric layer in the region of the outer edge zone of the window.

A semiconductor device with a passivation layer scheme with a structured edge region having a flat and gentle sloped edge profile is obtained by this method. The isolation layer cannot be underetched owing to its covering formed by the first dielectric layer. Any underetching of the first dielectric layer is eliminated by post etching of the edge of the second dielectric layer in the final etching process. So that the second dielectric layer party covers the first dielectric layer in the region of the outer edge zone of the window.

Preferably, etching of the window(s) takes place by means of one photolithographic process, and the first and the second dielectric layer are etched by means of one photoresist mask and two selective etchants, the second dielectric layer being first structured with the photoresist mask and an etchant which is selective relative to the first dielectric layer, whereupon the photoresist mask is removed and the first dielectric layer is structured with an etchant which is selective relative to the second dielectric layer, during which the second dielectric layer serves as a mask, and subsequently the second dielectric layer is once more etched with a selective etchant until the first dielectric layer has become partly exposed in the region of the outer edge zone of the window.

By this method the number of photolithographic structuring steps required to structure the passivation scheme is reduced by one mask step. This results not only in a cost reduction, but also in a significant improvement of the process reliability and product quality because any underetching in the passivation layer scheme and in the isolation layers is avoided.

BRIEF DESCRIPTION OF THE DRAWING

The invention will be explained in more detail below with reference to a drawing, in which.

DETAILED DESCRIPTION OF THE PREFERRED EMBODIMENTS

Figure 1:
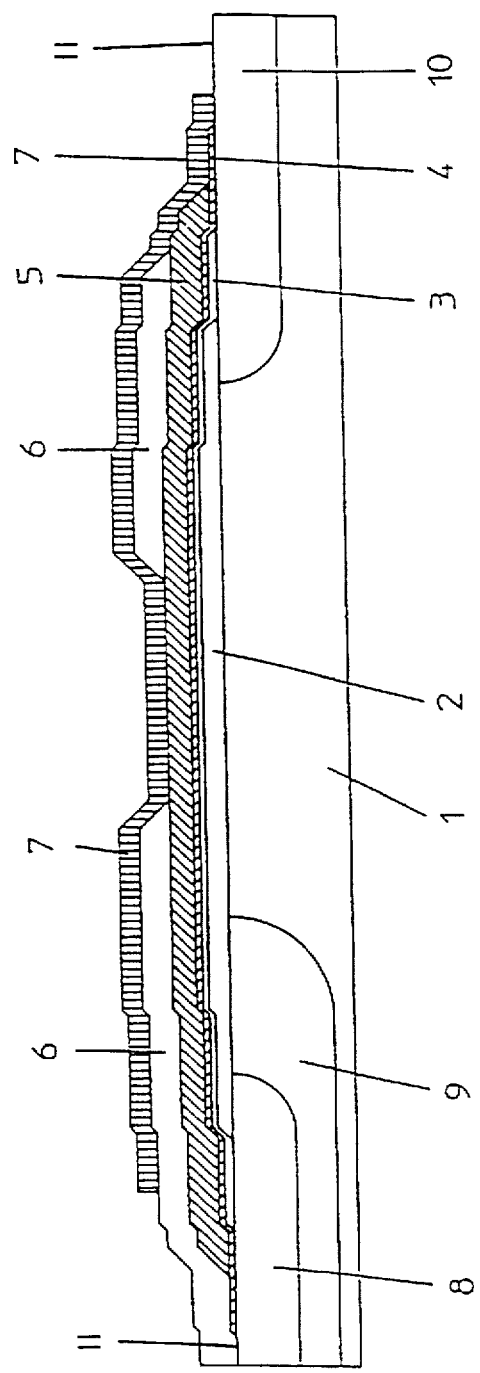
FIG. 1 is a cross-section of the planar transistor according to the invention.

The planar transistor according to the invention is built up on a substrate 1 which usually consists of 0.2 mm thick n- or p-type conducting silicon monocrystals of 0.1 to 10 mm$^2$ surface area. The substrate comprises pn junctions which are introduced by diffusion. These pn junctions define, for example, the transition from the base diffusion region 9 to the emitter diffusion region 8. The high doped channel stopper 10 is manufactured together with the emitter diffusion region and has the same conductivity type as the substrate. The high doped channel stopper 10, which marks the outer edge of the discrete device, prevents the flow of leakage currents from the base through a channel below the isolation layer 2 across the transistor sawing lane to the collector at the back.

The first isolation layer 2 usually consists of an impermeable layer of thermally generated silicon dioxide. The edges of the isolation layer(s) define one or several windows 11. The substrate surface is initially exposed in the regions of these original windows.

The first isolation layer 2 may be fully covered by a second isolation layer 3. This second isolation layer extends over the edge of the first isolation layer and covers the substrate in an outer edge zone of the original window. In this case, the edges of the second isolation layer define the window(s). The second isolation layer usually has a layer thickness of 0.1 to 0.4 μm and covers the substrate over a width of at least 1 μm.

The isolation layers are fully covered by a first dielectric layer 4. This first dielectric layer extends over the edge of the upper isolation layer and covers the substrate in an outer edge zone of the original window. The first dielectric layer usually has a thickness of 0.1 to 0.2 μm, the outer edge zone a width of at least 1 μm. The second dielectric layer 5 extends over the first dielectric layer and also over the outer edge of the isolation layers. The edge of the second dielectric layer is reset compared to the edge of the first dielectric layer by at least 0.1 μm. The layer thickness of the second dielectric layer is usually 0.1 to 1.6 μm.

The edge bevel usually encloses a flank angle of 30° to 60° with the substrate surface.

The metallization 6 covers the window, the structured edge region of the passivation layer scheme, and part of the second dielectric layer so as to form a planar contact.

The metallization may alternatively be provided on the second dielectric layer only as an electrode and may have an ohmic contact with the substrate in at least one corner of the semiconductor device.

To protect the semiconductor device against mechanical and chemical attacks, it may in addition be coated with a protective layer 7.

The component according to the invention may be manufactured as a discrete semiconductor device or as a portion of an integrated circuit in the planar technology. In practice, manufacture starts with a silicon wafer which is much larger than necessary for the manufacture of a single transistor or a certain circuit, and a chessboard-type pattern with a raster pitch of approximately 0.3 to 3.5 mm is used for forming the covering oxide structures which prevent the diffusion of dopants in locations where this is not desired. Up to 80,000 discrete transistors, or 50 to 100 solid state circuits are thus created simultaneously through processing of a single silicon wafer. If all layers have been provided and structured and the contacts and conductor tracks have been manufactured that the silicon wafer is separated into the individual semiconductor devices which may subsequently be contacted and packaged.

The manufacture of the passivation layer scheme according to the invention starts with a prepared wafer in which the base and emitter diffusion regions have already been provided and which already comprises one or several, usually two isolation layers. The first isolation layer of thermally generated silicon dioxide is applied in known manner and provided with windows. The second isolation layer of thermal silicon oxide with phosphorus is formed during the emitter process used for npn transistors and during the base contact diffusion process used for pnp transistors.

Small contact windows for the base and emitter are subsequently etched into the two isolation layers by means of a mask in the subsequent photolithography and etching step. Both isolation layers are structured with the same etchant, buffered hydrofluoric acid.

The dielectric layers for the passivation layer scheme are deposited on this basic structure through deposition from the gas phase. Usually, the passivation arrangement is formed by two dielectric layers. The first dielectric layer disposed on the upper isolation layer usually is a silicon nitride layer manufactured in a low-pressure CVD process, for example at 300–400 millitorr at 700° to 800° C. from $SiH_2Cl_2$ and $NH_3$. The second dielectric layer is usually a silicon dioxide layer generated in a plasma-enhanced process with a plasma excitation of, for example 380 kHz and 15 kW at 300° to 350° C. from $SiH_4$ and $N_2O$. Both layers are initially deposited over the entire surface. The two layers are structured jointly.

For this purpose, a photoresist mask is provided, exposed, and developed. Then the silicon dioxide layer is first etched isotropically with a mixture of hydrofluoric acid and ammonium fluoride. The silicon nitride layer is not attacked during this process step because the mixture of hydrofluoric acid and ammonium fluoride has a high degree of selectivity relative to silicon nitride. The photoresist mask is then removed. Subsequently, the silicon nitride layer is etched isotropically in the wet state with hot phosphoric acid, the previously etched $SiO_2$ layer acting as a mask. The $SiO_2$ layer is not attacked in this process step because also the hot phosphoric acid has a high selectivity relative to the deposited $SO_2$. To push back the edge of the silicon dioxide layer behind the edge of the silicon nitride, etching takes place subsequently once more with the mixture of hydrofluoric acid and ammonium fluoride.

The silicon nitride layer may alternatively be deposited in a plasma-enhanced process. In this case the second dielectric layer should be made from polyimide. A number of processes are available for depositing the silicon oxide, for example, deposition from tetraethyl orthosilicate in a hot-wall reactor, deposition from silane and oxygen in a CVD process at low temperature, deposition from silane and a nitrogen-hydrogen compound at higher temperature, or deposition in a spin-on process from suitable basic compounds (spin-on glass).

It is possible to choose alternative material combinations for the layer structure. However, a number of compatibility requirements must be fulfilled, in particular as regards diffusion, adhesion, selective etchants as described above, and mechanical and thermal stresses. The following combinations have proved to be suitable for the first and second dielectric layers:

silicon dioxide in the form of plasma oxide, LTO ("Low Temperature Oxide"), TEOS (TetraEthyl OrthoSilicate as the starting compound), or LPCVD oxide as the first layer, with hydrofluoric acid and ammonium fluoride as the etchant, and polyimide as the second layer with hydrazine as the etchant, polyimide as the first layer with hydrazine as the etchant, and silicon nitride in the form of plasma nitride as the second layer with hot phosphoric acid as the etchant, silicon nitride in the form of plasma nitride or LPCVD nitride as the first layer with phosphoric acid as the etchant, and polyimide as the second layer with hydrazine as the etchant, or silicon nitride in the form of LPCVD nitride as the first layer with hot phosphoric acid as the etchant, and silicon dioxide in the form of LTO or TEOS or spin-on glass (SOG) as the second layer with hydrofluoric acid and ammonium fluoride as the etchant.

The metallization is deposited in a next process step, usually by sputtering or evaporation of high-purity aluminum.

Finally, the metallization is usually protected against mechanical damage, corrosion, and ion contamination by a protection layer. The device is covered with a layer of silicon nitride, $SiO_2$, phosphor-silicate glass, or polyimide for this purpose.

Owing to the improved passivation layer scheme, planar bipolar npn and pnp high-voltage transistors achieve a breakdown voltage of 500 to 1.000 V, and planar npn and pnp Darlington transistors a breakdown voltage of up to 200 V. The semiconductor devices were subjected to an accelerated life test (ALT) in the form of storage at 150° C. They reached a lifetime of more than 1,000 h and the reject rate was substantially reduced. The method according to the invention saves one photolithographic structuring step as two dielectric layers can be structured with one photo mask. This results not only in a cost reduction, but also in a significant improvement in process reliability and product quality because any underetching in the passivation layer scheme and in the isolation layers is avoided.

What is claimed is:

1. A semiconducting device with a substrate, an isolation layer having a window defining an edge of the isolation layer, a passivation layer scheme lying on the isolation layer, and a metallization lying on the passivation layer scheme, wherein the passivation layer scheme comprises first and second dielectric layers, the first dielectric layer covering the isolation layer and the edge of the isolation layer and extending beyond the edge of the isolation layer to cover a portion of the substrate in the window adjacent the edge of the isolation layer, and the second dielectric layer covering the first dielectric layer everywhere that the first dielectric layer overlies the isolation layer and the edge of the isolation layer but which extends beyond the edge of the isolation layer not as far as the first dielectric layer.

2. A semiconductor device as claimed in claim 1, characterized in that the first and second dielectric layers each have a uniform layer thickness.

3. A semiconductor device as claimed in claim 2, characterized in that it has two isolation layers, the first isolation layer consisting of a thermally generated silicon oxide and the second isolation layer consisting of a thermally generated silicon oxide comprising phosphorus.

4. A semiconductor device as claimed in claim 3, characterized in that the first dielectric layer is made of silicon nitride and the second dielectric layer is made of silicon dioxide.

5. A semiconductor device as claimed in claim 3, characterized in that the first dielectric layer is made of silicon oxide or silicon nitride and the second dielectric layer is made of polyimide.

6. A semiconductor device as claimed in claim 3, characterized in that the first dielectric layer is made of polyimide and the second dielectric layer is made of silicon nitride.

* * * * *